(12) United States Patent
Smith et al.

(10) Patent No.: US 7,193,443 B1
(45) Date of Patent: Mar. 20, 2007

(54) DIFFERENTIAL OUTPUT BUFFER WITH SUPER SIZE

(75) Inventors: Mian Z. Smith, Los Altos, CA (US); Gregory Starr, San Jose, CA (US)

(73) Assignee: Altera Corporation, San Jose, CA (US)

(*) Notice: Subject to any disclaimer, the term of this patent is extended or adjusted under 35 U.S.C. 154(b) by 77 days.

(21) Appl. No.: 11/135,732

(22) Filed: May 23, 2005

(51) Int. Cl.
    *H03K 19/0175* (2006.01)
(52) U.S. Cl. .......................... 326/83; 326/27
(58) Field of Classification Search .......... 326/26, 326/27, 63, 68, 83–87
See application file for complete search history.

(56) References Cited

U.S. PATENT DOCUMENTS

| | | |
|---|---|---|
| 4,362,955 A | 12/1982 | Davenport |
| 5,227,673 A | 7/1993 | Ta |
| 5,406,139 A | 4/1995 | Sharpe-Geisler |
| 6,246,270 B1 | 6/2001 | Wang et al. |
| 6,353,338 B1 | 3/2002 | Fiedler et al. |
| 6,370,066 B1 | 4/2002 | Nagano |
| 6,377,122 B1 | 4/2002 | Rokhsaz |
| 6,529,036 B1 | 3/2003 | Rai |
| 6,531,892 B2 | 3/2003 | Ghia et al. |
| 6,566,950 B1 | 5/2003 | Rokhsaz |
| 6,642,878 B2 * | 11/2003 | Libove et al. ............... 341/144 |
| 2002/0027808 A1 * | 3/2002 | Nagano ................ 365/189.09 |

OTHER PUBLICATIONS

Altera Data Sheet, "Max 7000: Programmable Logic Device Family," Altera Corp., ver. 6.6, Jun. 2003, pp. 1-21.
Altera Data Sheet, "Max 9000: Programmable Logic Device Family," Altera Corp., ver. 6.5, Jun. 2003, pp. 1-46.
Altera Data Sheet, "FLEX 10K: Embedded Programmable Logic Device Family," Altera Corp., ver. 4.2, Jan. 2003, pp. 1-40.
*Cyclone Device Handbook*. vol. 1, Chapter 2, "Cyclone Architecture," Altera Corp., CS 1002-1.2, Oct. 2003, pp. 2-1 to 2-56.

* cited by examiner

*Primary Examiner*—Don Le
(74) *Attorney, Agent, or Firm*—Babak S. Sani; Townsend and Townsend and Crew LLP (57) ABSTRACT

Various embodiments for differential output circuits with reduced transistor sizes and reduced DC currents provide efficient and flexible differential driver circuits. AC current boosting enables the switching transistors that drive the output nodes to be smaller in size. The AC current boost circuitry is shared by both switching current paths in the differential output circuit to reduce size and parasitic effects. Similarly, DC current circuitry is also shared by both switching current paths. The AC boost circuit and the DC bias circuit are made programmable to enable the output circuit to support multiple I/O standards with different specifications.

24 Claims, 6 Drawing Sheets

FIG. 7

DIFFERENTIAL OUTPUT BUFFER WITH SUPER SIZE

BACKGROUND

The present invention relates in general to integrated circuits and in particular to programmable differential output circuits.

To meet the demands of today's applications, integrated circuits are being designed to operate at higher speeds with lower power supply voltages. One technique for enabling high frequency operation at lower voltages is differential signaling. In differential signaling, logic levels are represented by the difference between a pair of complementary signals. Instead of processing signals that swing between the power supplies, circuits designed to process differential signals need only detect a relatively small difference in voltage between the two complementary signals. The much smaller voltage swing and the lower voltage level characteristics of differential signaling facilitate high speed operation at lower voltages.

Integrated circuits that transmit differential signals externally require a differential output buffer or output driver circuit. The design of a differential output driver is dictated by a set of specifications that defines the speed and output voltage level requirements for a given loading condition. To support these often stringent specifications the output transistors of a typical differential driver circuit are required to source or sink large amounts of current at high switching speeds. Differential output drivers are therefore commonly designed with very large output transistors. Larger output transistors, however, exhibit undesirable parasitic effects and result in increased silicon area and therefore costs. Further, because over the years different standards have evolved for differential signaling, an output driver that is designed to meet one set of specifications may not be suitable for applications using a different standard. An output driver that is designed to support multiple standards is often designed for the worst case specification, which typically results in inefficient circuits that employ larger device sizes and consume larger DC operating currents. There is therefore a need for a differential output driver circuit that consumes less silicon area and lower DC current, and that can support multiple specifications defined by various differential signaling standards without sacrificing area and power consumption.

SUMMARY

The present invention provides method and circuitry for implementing improved differential output drivers or output buffers that are smaller in size, consume less power and can be programmed to support multiple specifications. In various embodiments, output circuits employ shared AC boost current paths that are turned on during the switching of driver transistors. This allows the driver transistors that connect to the output nodes to be smaller in size resulting in reduced parasitic capacitance at the output nodes. The sharing of the AC boost current paths by both differential legs of the output circuit further reduces circuit size. The DC current paths for both legs of the differential output circuit are also shared for yet further reduction in circuit size.

According to one aspect of the invention, a differential output driver circuit includes first and second current paths that respectively drive first and second output terminals in response to a differential input signal. The first and second current paths are coupled to form an upper common node and a lower common node, and share a common upper AC current boost path that couples between the upper common node and an upper power supply terminal, and a lower AC current boost path that couples between the lower common node and a lower power supply terminal. The upper and lower AC current boost paths are configured to provide additional boost current to the output current paths during switching. Because the driver transistors in each output current path can rely on the AC current boost paths during switching to provide the needed current drive, their size can be made smaller. Smaller driver transistors in turn results in reduced parasitic capacitance at the output terminals and therefore faster output switching. The differential output driver circuit further comprises an upper DC bias path that couples between the upper common node and the upper power supply terminal, and a lower DC bias path that couples between the lower common node and the lower power supply terminal. The DC bias paths set the DC common mode voltage of the differential output driver circuit. This configuration reduces the circuit size without compromising switching speed.

According to another aspect of the invention, the current drive capability of the differential output driver circuit can be programmably adjusted to meet different differential signaling standards. This is accomplished by programmably coupling one or more additional DC bias transistors in parallel. By programmably connecting or disconnecting additional DC bias transistors in parallel, the current drive capability of the driver circuit can be varied to meet a desired standard. Additional AC boost transistors can be similarly connected in parallel to vary the current switching speed of the driver circuit.

The following detailed description along with the accompanying diagrams will provide a better understanding of the nature and advantages of the present invention.

DETAILED DESCRIPTION

The present invention provides improved method and circuitry for differential output circuits. An output driver or output buffer as used herein refers to any circuit that receives an input signal, conditions the signal and drives it onto an output node. While the invention is described herein in the context of a circuit that drives external terminals, it is not so limited and similar inventive concepts can be applied to buffers and repeaters that drive internal nodes. Also, while the specific embodiments described herein use transistors of specific polarity, it will be appreciated that the polarity of the transistors can be varied without departing from the scope of the invention. Some of these variations, but by no means all, are described below.

Figure 1:
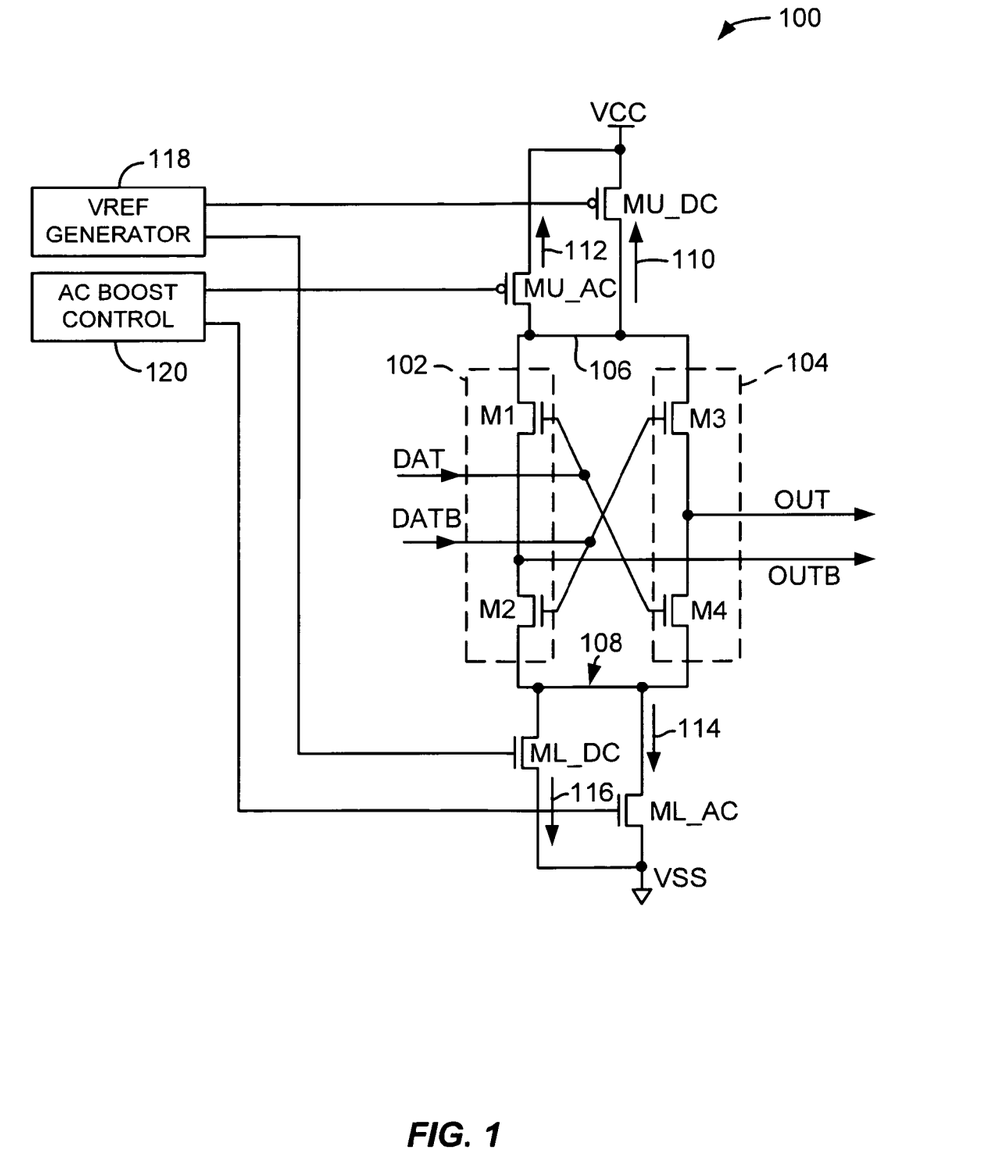
FIG. 1 is a circuit diagram showing a differential output buffer according to an exemplary embodiment of the invention.

FIG. 1 is a circuit diagram for a differential output driver circuit 100 according to an exemplary embodiment of the invention. Output driver circuit 100 includes a first current path 102 having a pair of serially-connected transistors M1 and M2, and a second current path 104 having a pair of serially-connected transistors M3 and M4. The common node between the transistors in each current path connects to a respective output node OUT and OUTB as shown. In this exemplary embodiment, transistors M1, M2, M3 and M4 are n-channel transistors. P-channel transistors can also be used as described further below. The gate terminals of transistors M1, M2 are cross-coupled with the gate terminals of transistors M3 and M4, and receive complementary input signals DAT and DATB, respectively, as shown. The drain terminals of transistors M1 and M3 connect to form an upper common node 106 between current paths 102 and 104. The source terminals of transistors M2 and M4 connect to form a lower common node 108 between the two current paths. An upper DC current path 110 couples node 106 to an upper power supply terminal VCC. An upper AC boost current path 112 couples node 106 to the upper power supply terminal VCC. In this embodiment, upper DC current path 110 includes a p-channel transistor MU_DC, and upper AC boost current path 112 includes a p-channel transistor MU_AC. A similar circuit couples the lower common node 108 to a lower power supply terminal VSS. The lower circuit includes a lower DC current path 114 that couples node 108 to lower power supply terminal VSS, and a lower AC boost current path 116 that couples node 108 to the lower power supply terminal VSS. In this embodiment, lower DC current path 114 includes an n-channel transistor ML_DC, and lower AC boost current path 116 includes an n-channel transistor ML_AC. In this way, both current paths 102 and 104 share the same upper and lower DC current and AC boost current paths. The gate terminals of DC current transistors MU_DC and ML_DC respectively receive reference signals VrefU and VrefL generated by a VREF generator circuit 118. These transistors are biased at the desired voltage level to set the target common mode voltage and target output current for the output driver, which translate to the differential output signal Vod through a termination resistor (not shown). The gate terminals of AC boost transistors MU_AC and ML_AC respectively receive AC boost signals VbstU and VbstL generated by an AC boost control block 120. AC boost signals VbstU and VbstL are relatively short pulses that momentarily turn on the boost transistors during switching.

In operation, when complementary input signals DAT and DATB are at logic high and logic low levels, respectively, switching transistors M1 and M4 are turned on and transistors M2 and M3 are turned off. Transisor M1 thus pulls node OUTB up to VCC through upper DC current path 110, and transistor M4 pulls node OUT down to VSS through lower DC current path 114. The reverse occurs when complementary input signals DAT and DATB are at logic low and logic high levels, respectively. That is, when DAT is low and DATB is high, transistors M2 and M3 are on and transistors M1 and M1 are off. Node OUT is thus pulled up to VCC by transistor M3 through upper DC current path 110, and node OUTB is pulled low to VSS by transistor M2 through lower DC current path 114. AC boost transistors MU_AC and ML_AC are turned on by signals VbstU and VbstL during the switching in both directions to provide additional boost current. Switching transistors M1, M2, M3 and M4 can thus be made smaller since they need not source or sink all of the switching current that is necessary to drive the output nodes. Furthermore, because at any given time only one of the upper switching transistors M1 or M3 and only one of the lower switching transistors M2 or M4 is on, the same upper and lower AC and DC current paths can be shared by both switching current paths 102 and 104. This results in significant area savings and reduction in DC operating current without any penalty in switching speed. Moreover, to the extent the parasitic capacitance at output nodes OUT and OUTB is reduced due to the reduced sizes of switching transistors M1, M2, M3 and M4, the output nodes are made faster. It should also be noted that since the DC current path and AC boost path transistors are stacked with switch devices (i.e., do not directly connect to the output nodes), their contributions to output capacitance is minimized.

Figure 2A:
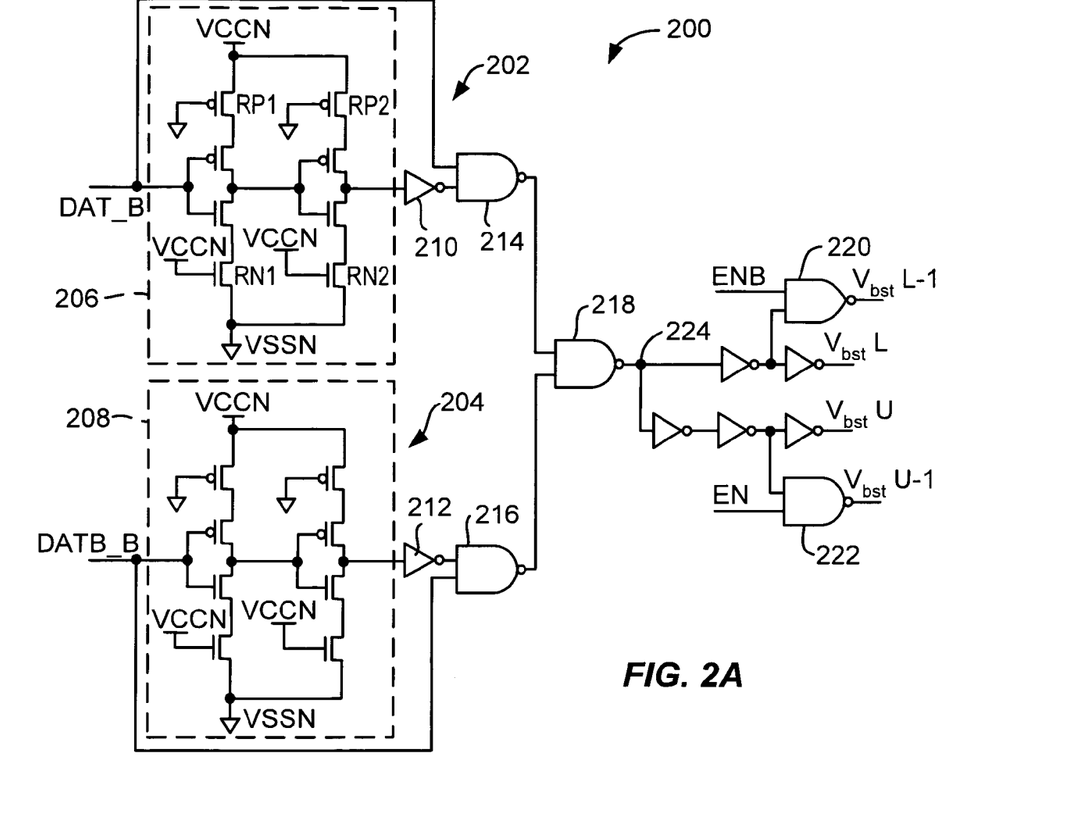
FIGS. 2A and 2B show an exemplary implementation for the AC boost control circuit and a corresponding timing diagram, respectively.
Figure 2B:
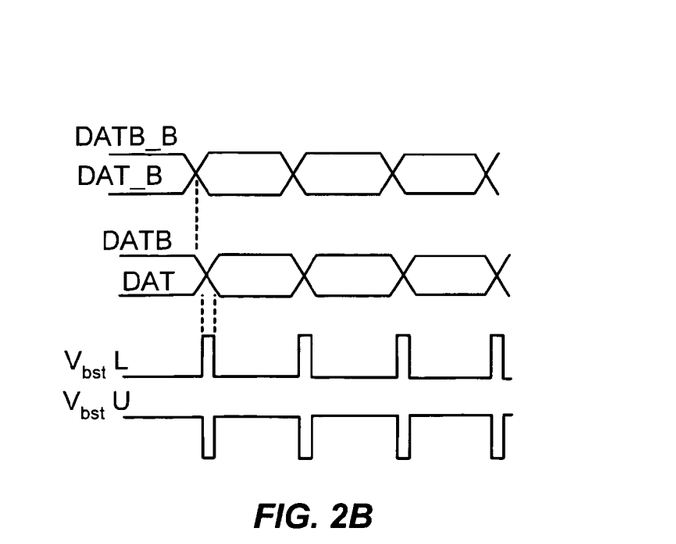

The common mode voltage Vcm as well as the differential swing Vod of the output driver circuit can be accurately controlled by reference voltages VrefU and VrefL that are generated by VERF generator 118. VREF generator 118 is preferably designed to generate VrefU and VrefL signals that are substantially independent of power supply and temperature variations. Once the common mode voltage Vcm is fixed by the DC current paths, the AC current boost paths are operated to balance output switching to maintain a stable common mode voltage Vcm. As described above, AC current boost is needed and activated only during output switching. Thus AC boost control block 120 generates narrow pulses that activate transistors MU_AC and ML_AC when input singlas DAT and DATB switch. Referring to FIGS. 2A and 2B, there are shown an exemplary circuit 200 for AC boost control block 120 and a corresponding timing diagram, respectively. AC boost control circuit 200 includes two one-shot or pulse generators 202 and 204 that respectively receive signals DAT_B and DATB_B. Signals DAT_B and DATB_B are identical to input signals DAT and DATB except that they are ahead of input signals DAT and DATB in phase as shown in FIG. 2B. Each one-shot circuit 202 and 204 is made up of a NAND gate that receives the boost data input (DAT_B or DATB_B) directly in one input and a delayed and inverted version of the same signal in the other input. The delayed version of the boost data input signal goes through a delay cell (206 or 208) and an inverter (210 or 212). NAND gate 214 thus generates a narrow pulse at each rising edge of DAT_B signal, and NAND gate 216 generates a narrow pulse at each rising edge of DATB_B signal. A third NAND gate 218 combines the outputs of one-shot circuits 202 and 204 and generates signals VbstU and VbstL at the outputs of buffering inventers as shown in FIG. 2A.

In one embodiment, the transistors inside NAND gate 218 are designed with skewed width to length W/L ratios to substantially balance the output slew rate for both the falling edge and the rising edge of the signal at node 224. The width of each narrow pulse depends on the amount of delay introduced by the delay cells 206, 208 and the inventors 210, 212 in the one-shot circuits 202 and 204. Delay cells 206, 208 can be implemented in a number of different ways. In the example shown in FIG. 2A, delay cells 206, 208 include a pair of serially-connected inverters with resistive loads (RP1/RN1 and RP2/RN2 in delay cell 206) to slow down signal propagation. In one embodiment, the pulse widths of AC current boost control signals VbstU and VbstL can be programmably controlled to a desired amount. This can be achieved, for example, by programmably connecting additional resistive load devices to existing load devices in the inverters inside each delay cell. Alternatively, additional delay cells can be added in series with delay cells 206 and 208 in each one-shot circuit 202 and 204, that can be programmably bypassed by pass transistors. AC current boost control circuit 200 further includes a NOR gate 220 and a NAND gate 222 at its output that generate additional control signals VbstU-1 and VbstL-1 in response to enable signals EN and ENB, respectively. This part of the circuit will be described in greater detail further below.

Figure 3:
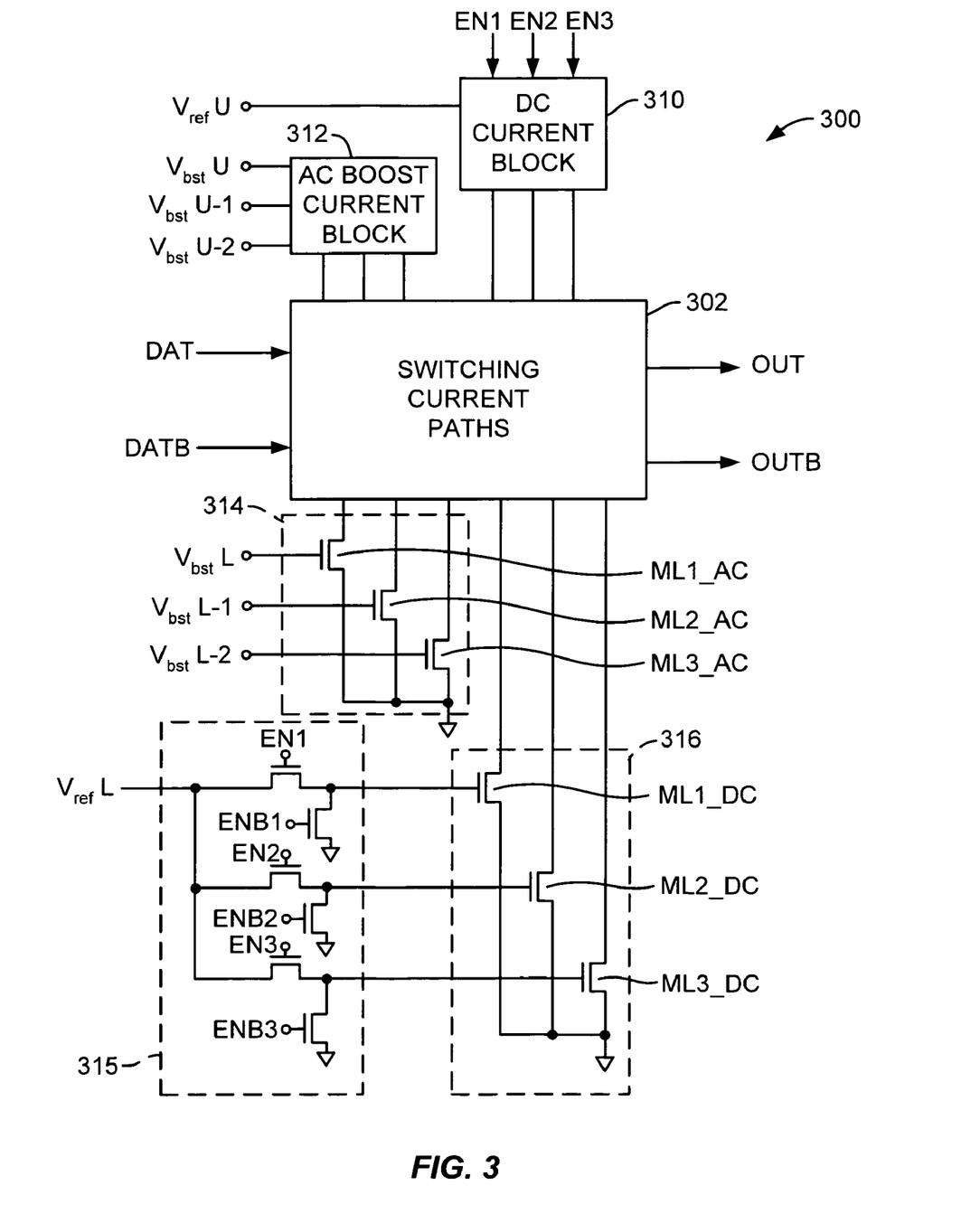
FIG. 3 is a circuit diagram illustrating a programmable output buffer according to an exemplary embodiment of the invention.

According to another aspect of the present invention, certain performance characteristics of the differential output driver are made programmable to allow the driver to support varying signaling standards. Specifically, the output common mode voltage Vcm and the output differential swing Vod are the typical requirements that change from one signaling standard to another. The present invention allows for programmably varying these two operating conditions of the differential output driver so that the same circuit can be programmed to support different standards. According to this embodiment of the invention, both the output common mode voltage and the differential voltage swing can be varied by making the DC current path and the AC boost current path programmable. FIG. 3 shows a simplified and exemplary circuit diagram of a programmable differential output buffer 300 according to this embodiment of the present invention. Block 302 includes the primary switching current paths that can be implemented as in FIG. 1 (102 and 104). However, instead of a single upper and single lower DC current path, in this embodiment, multiple DC current paths are provided that when enabled connect in parallel for both the upper and lower current paths. Similarly, instead of a single upper and single lower AC current boost path, multiple current boost paths are provided that when enabled connect in parallel for both the upper and lower current paths. In the exemplary implementation shown in FIG. 3, three parallel current paths are provided for each of the DC and AC boost paths. Accordingly, lower DC current block 316 includes three transistors ML1_DC, ML2_DC and ML3_DC with source and drain terminals connected in parallel and gate terminals that connect to VrefL via a multiplexer (MUX) 315. MUX 315 includes pass transistors that are receive enable signals EN1, EN2, EN3 and their complements as shown. When any of the enable signals is activated (logic high), VrefL is applied to the corresponding DC current path transistor. Therefore, if a specific standard requires a larger DC current, additional DC current path transistors are enabled. Because the variation between the standards can be smaller relative to the magnitude of the DC current requirement for any given standard, one of the DC current path transistors in each of the upper and lower blocks can be made large while the others that effect the change can be made smaller in size.

Lower AC boost current block 314 also includes three current paths made up of transistors ML1_AC, ML2_AC and ML3_AC, respectively. Because AC boost transistors are normally off unless activated by a narrow pulse during switching, a MUX is not required to program the AC boost current. Instead, AC boost control circuit can be designed to generate separate boost pulses for each AC current boost transistor. Referring back to FIG. 2A, NOR gate 220 and NAND gate 222 that respond to enable signals EN and ENB provide one example of how programmable boost control signals can be generated. Upper DC current block 310 and upper AC boost current block 312 are similarly designed as their corresponding lower blocks except that the transistors are p-channel. It is to be understood that while in this embodiment shows a differential output buffer that can be programmed to support three different signaling specifications, the circuit can be modified to support fewer or more standards by decreasing or increasing the number of parallel current paths.

Various aspects of the present invention have been described in the context of specific circuit implementations for illustrative purposes. Other variations and modifications are possible. For example, to further minimize parasitic capacitance of the output driver circuit it is possible to combine both the DC current path and AC boost current path into a single current path. Referring back to FIG. 1, according this alternative embodiment, a single upper transistor replaces both MU_DC and MU_AC, and a single lower transistor replaces both ML_DC and ML_AC. To perform both the DC biasing function and the AC boosting function, a control circuit drives the gate of the single transistor such that only during data switching the transistor provides boost current, and the rest of the time it receives a bias voltage to control the DC operation of the driver transistor. While a single transistor implementation is possible, to separately control Vcm and Vod it may be preferred to have separate DC and AC boost current paths as in the embodiments described above.

Figure 4:
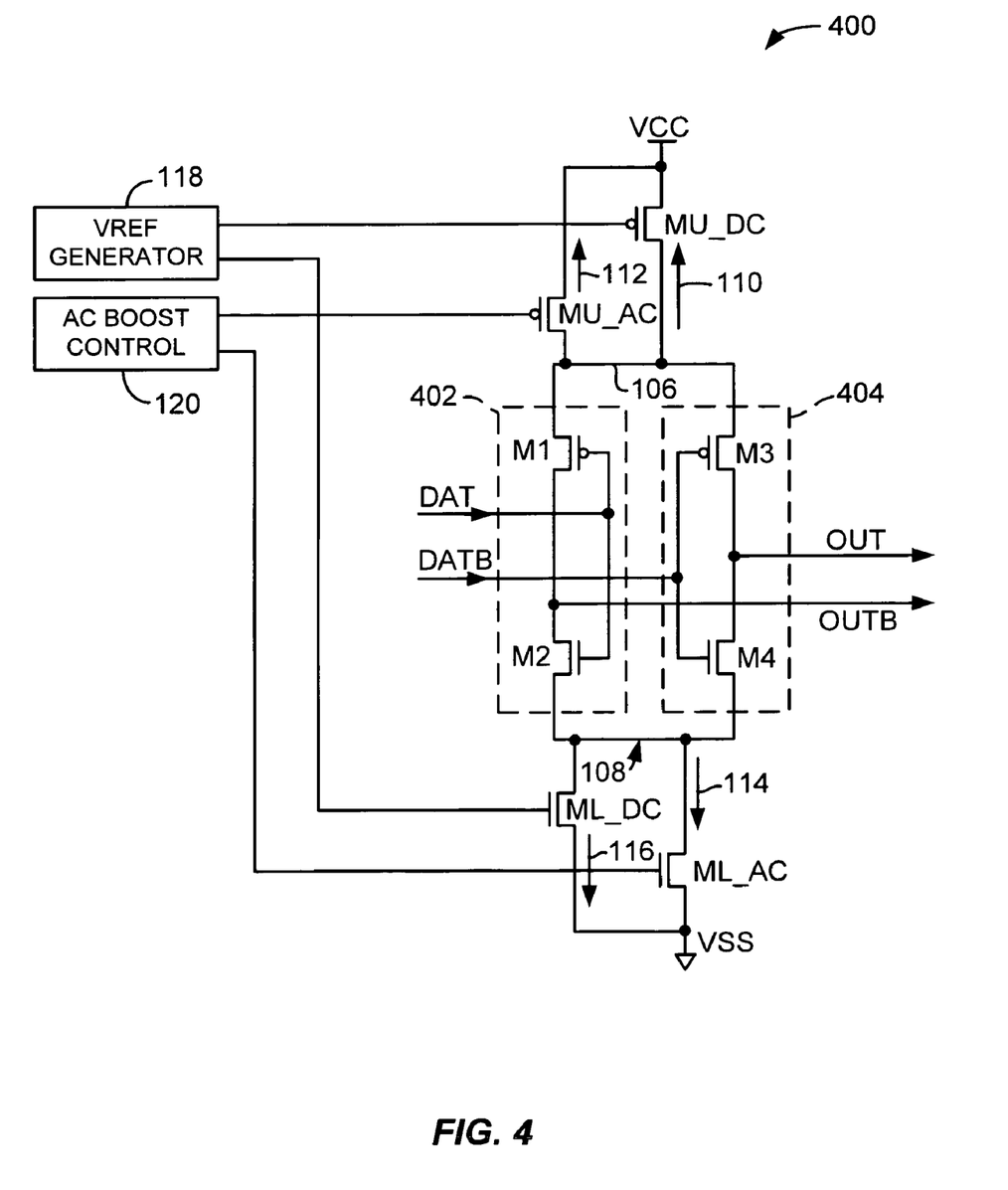
FIG. 4 shows a differential output buffer circuit using both n-channel and p-channel driver transistors according to another exemplary embodiment of the invention.
Figure 5:
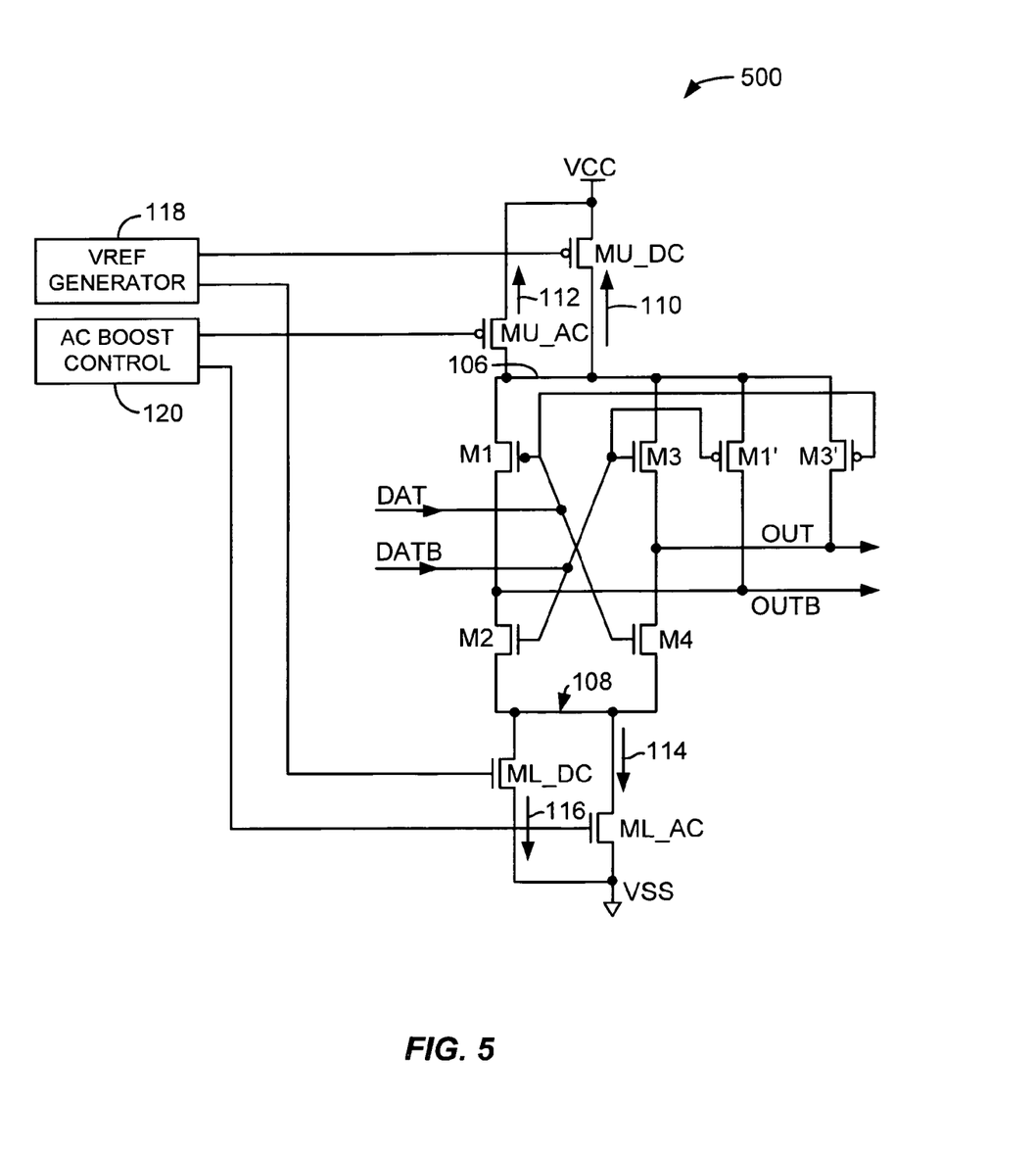
FIG. 5 shows yet another embodiment for a differential output buffer circuit according to the present invention.

Other possible variations include the use of opposite polarity transistors in the switching current paths (102 and 104 in FIG. 1 or block 302 in FIG. 3). In the embodiment shown in FIG. 1, all transistors M1, M2, M3 and M4 are n-channel transistors. Therefore, when turned on, the gate terminals of transistors M1 and M3 must be one threshold voltage Vt above the voltage level at the output nodes. Thus, the output nodes cannot swing more than VCC-Vt. For some specifications, this Vt drop is acceptable, especially when DAT and DATB swing from rail to rail. However, depending on the requirements of a given standard it may be more efficient to employ p-channel transistors for M1 and M3. A circuit according to this alternative embodiment is shown in FIG. 4. Differential output driver circuit 400 is identical to driver circuit 100 of FIG. 1 with two exceptions: transistors M1 and M3 in circuit 400 are p-channel, and instead of cross-coupling the gate terminals of transistors M1, M2, M3 and M4, they connect to form two inverters 402 and 404 as shown. The effect of using p-channel transistors for M1 and M3 is that the Vt drop is eliminated and when M1 and M3 are turned on the output nodes can swing all the way to VCC. In all other respects, driver circuit 400 operates the same as driver circuit 100. It is also possible to include both n-channel transistors and p-channel transistors on the pull-up path of the switching circuit. A circuit according to such embodiment is shown in FIG. 5 wherein two additional p-channel transistors M1' and M3' are added in parallel to n-channel transistors M1 and M3. In this embodiment, output driver circuit 500 has the flexibility to support specifications that may require one or the other of the switching transistor arrangements. The selection between p-channel or n-channel transistors can be made programmable by enabling one or the other.

Figure 6:
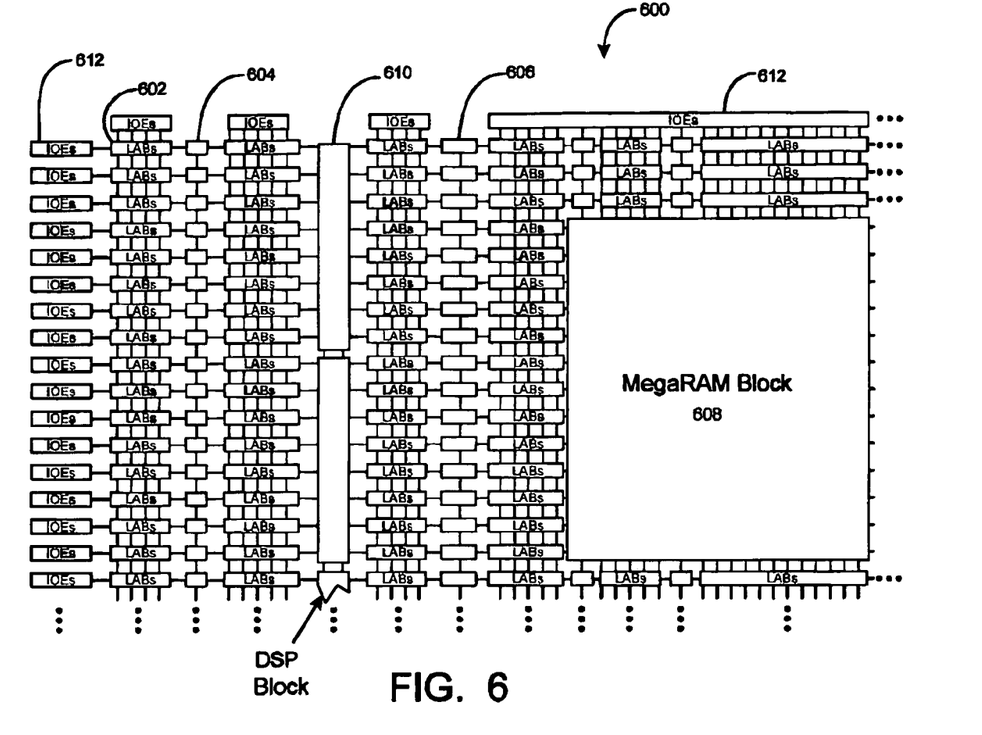
FIG. 6 is a simplified block diagram of a programmable logic device implementing the differential output buffer according to an embodiment of the present invention.

While the various embodiments for differential output drivers described above can be used in many different types of integrated circuits, they are particularly suitable for field programmable gate arrays (FPGAs) or programmable logic devices (PLDs). Today's high-density PLDs are not only used, with quick turn-around, to implement custom logic, they provide resources that allow them to implement system solutions for applications such as networking, wireless and general high-bandwidth telecommunication among others. Such applications typically require high speed I/O interface solutions with support for a variety of differential I/O standards. FIG. 6 is a simplified partial block diagram of an exemplary high-density PLD 600 wherein the programmable output drivr circuits according to the present invention can be utilized. PLD 600 includes a two-dimensional array of programmable logic array blocks (or LABs) 602 that are interconnected by a network of column and row interconnects of varying length and speed. LABs 602 include multiple (e.g., 10) logic elements (or LEs), an LE being a small unit of logic that provides for efficient implementation of user defined logic functions. PLD 600 also includes a distributed memory structure including RAM blocks of varying sizes provided throughout the array. The RAM blocks include, for example, 512 bit blocks 604, 4K blocks 606 and a MegaBlock 508 providing 512K bits of RAM. These memory blocks may also include shift registers and FIFO buffers. PLD 600 further includes digital signal processing (DSP) blocks 610 that can implement, for example, multipliers with add or subtract features. I/O elements (IOEs) 612 located, in this example, around the periphery of the device support various differential I/O standards according to the embodiments described above and may also provide single-ended I/O circuitry as well as programmable on-chip termination. An example of a high performance PLD of this type can be found in the Altera Stratix II family of FPGAs. Further details can be found in a handbook at http://www.altera.com/literature/hb/stx2/stratix2_handbook.pdf, which is hereby incorporated by reference in its entirety. Specifically, section III of the handbook provides additional details for the various I/O standards that can be supported by the improved output drivers according to the present invention. It is to be understood that PLD 600 is described herein for illustrative purposes only and that the present invention can be implemented in many different types integrated circuits.

Figure 7:
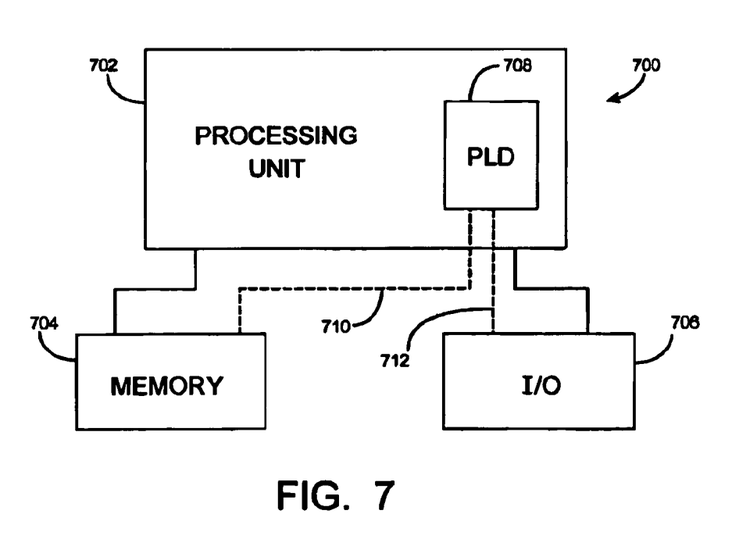
FIG. 7 is a block diagram of an electronic system that embodies differential output buffers according to another embodiment of the present invention.

While PLDs of the type shown in FIG. 6 provide many of the resources required to implement system level solutions, the present invention can also benefit systems wherein a PLD with the I/O structure according to the various embodiments of the invention is one of several components. FIG. 7 shows a block diagram of an exemplary digital system 700, within which the present invention may be embodied. System 700 may be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 700 may be provided on a single board, on multiple boards, or within multiple enclosures.

System 700 includes a processing unit 702, a memory unit 704 and an I/O unit 706 interconnected together by one or more buses. According to this exemplary embodiment, a programmable logic device 708 is embedded in processing unit 702. PLD 708 may serve many different purposes within the system in FIG. 7. PLD 708 may, for example, be a logical building block of processing unit 702, supporting its internal and external operations. PLD 908 is programmed to implement the logical functions necessary to carry on its particular role in system operation. PLD 708 may be specially coupled to memory 704 through connection 710 and to I/O unit 706 through connection 712. Processing unit 702 may direct data to an appropriate system component for processing or storage, execute a program stored in memory 704 or receive and transmit data via I/O unit 706, or other similar function. Processing unit 702 may be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU. For example, instead of a CPU, one or more PLDs 708 may control the logical operations of the system. In an embodiment, PLD 708 acts as a reconfigurable processor, which can be reprogrammed as needed to handle a particular computing task. Alternately, programmable logic device 708 may itself include an embedded microprocessor. Memory unit 704 may be a random access memory (RAM), read only memory (ROM), fixed or flexible disk media, PC Card flash disk memory, tape, or any other storage means, or any combination of these storage means.

The present invention thus provides various techniques for implementing high speed differential output driver circuits that consume less area and DC current. The techniques of the present invention allow an integrated circuit to meet a variety of different high speed differential I/O standards. While the above provides a complete description of specific embodiments of the present invention, it is possible to use various alternatives, modifications and equivalents. Therefore, the scope of the present invention should not be limited to the specific and illustrative embodiments described above, and should instead be determined with reference to the appended claims along with their full scope of equivalents.

What is claimed is:

1. A differential output circuit comprising:
 a first switching current path coupled to a first output node;
 a second switching current path coupled to a second output node,
 the first and second switching current paths couple together to form an upper common node and a lower common node, and are configured to drive the first output node and the second output node in response to a differential input signal;
 an upper AC boost current path coupled between the upper common node and an upper power supply terminal, the upper AC boost current path providing an AC current boost to one of either the first or the second switching current paths in response to an upper AC boost control signal; and
 a lower AC boost current path coupled between the lower common node and a lower power supply terminal, the lower AC boost current path providing an AC current boost to one of either the first or the second switching current paths in response to a lower AC boost control signal.

2. The differential output circuit of claim 1 further comprising:
 an upper DC current path coupled between the upper common node and the upper power supply terminal; and
 a lower DC current path coupled between the lower common node and the lower power supply terminal,
 wherein, the upper and lower DC current paths control DC operation of the output circuit.

3. The differential output circuit of claim 2 wherein the first switching current path comprises a first transistor coupled between the first output node and the upper common node and a second transistor coupled between the first output node and the lower common node, and wherein, the second switching current path comprises a third transistor coupled between the second output node and the upper common node and a fourth transistor coupled between the second output node and the lower common node.

4. The differential output circuit of claim 3 wherein gate terminals of the first and fourth transistors are coupled to form a first input terminal and the gate terminals of the second and third transistors are coupled to form a second input terminal, the first and second input terminals being coupled to receive the differential input signal.

5. The differential output circuit of claim 3 wherein gate terminals of the first and second transistors are coupled to form a first input terminal and the gate terminals of the third and fourth transistors are coupled to form a second input terminal, the first and second input terminals being coupled to receive the differential input signal.

6. The differential output circuit of claim 3 wherein the first through fourth transistors are n-channel type and wherein the first switching current path further comprises a fifth transistor that is p-channel type coupled in parallel to the first transistor, and a sixth transistor that is p-channel type coupled in parallel to the third transistor.

7. The differential output circuit of claim 2 further comprising a DC control circuit coupled to the upper and lower DC boost current paths, and configured to generate an upper DC control signal to drive the upper DC current path and a lower DC control signal to drive the lower DC current path.

8. The differential output circuit of claim 1 further comprising an AC boost control circuit coupled to the upper and lower AC boost current paths, and configured to generate the upper boost control signal to drive the upper AC boost current path and the lower boost control signal to drive the lower AC boost current path.

9. The differential output circuit of claim 8 wherein the DC control circuit comprises a reference voltage generator that is substantially independent of power supply variations.

10. The differential output circuit of claim 7 wherein the AC boost control circuit is coupled to receive the differential input signal and to generate the upper and lower boost control signals in response to transitions in the differential input signal.

11. The differential output circuit of claim 8 wherein the DC control circuit comprises a reference voltage generator that is substantially independent of power supply variations.

12. The differential output circuit of claim 1 wherein an amount of AC boost current in the upper and lower AC boost current paths can be programmably adjusted.

13. The differential output circuit of claim 11 wherein each of the upper and lower AC boost current paths comprises a plurality of transistors coupled in parallel, each receiving a respective AC boost control signal.

14. The differential circuit of claim 2 wherein an amount of DC current in the upper and lower DC current paths can be programmably adjusted.

15. The differential output circuit of claim 13 wherein each of the upper and lower DC current paths comprises a plurality of transistors coupled in parallel, each receiving a respective DC control signal.

16. The differential output circuit of claim 1 wherein the upper AC boost current path comprises a transistor with its current-carrying terminals coupled between the upper common node and the upper power supply terminal and a gate terminal coupled to receive an upper AC boost control signal, and wherein, the lower AC boost current path comprises a transistor with its current-carrying terminals coupled between the lower common node and the lower power supply terminal and a gate terminal coupled to receive a lower AC boost control signal.

17. A programmable differential output circuit comprising:

a first switching current path coupled to a first output node;

a second switching current path coupled to a second output node, the first and second switching current paths couple together to form an upper common node and a lower common node, and are configured to drive the first output node and the second output node in response to a differential input signal;

an upper AC boost current path coupled between the upper common node and an upper power supply terminal, the upper AC boost current path providing a programmably variable AC current boost to one of either the first or the second switching current paths in response to an upper AC boost control signal; and a lower AC boost current path coupled between the lower common node and a lower power supply terminal, the lower AC boost current path providing a programmably variable AC current boost to one of either the first or the second switching current paths in response to a lower AC boost control signal.

18. The programmable differential output circuit of claim 16 further comprising:

a programmable upper DC current path coupled between the upper common node and the upper power supply terminal; and a programmable lower DC current path coupled between the lower common node and the lower power supply terminal, wherein, the upper and lower DC current paths programmably control DC operation of the output circuit.

19. The programmable differential output circuit of claim 16 wherein each of the upper and lower AC boost current paths comprises a plurality of parallel-coupled transistors that are selectively turned on in response to programmable boost control signals.

20. The programmable differential output circuit of claim 17 wherein each of the programmable upper and lower DC current paths comprises a plurality of parallel-coupled transistors that are selectively turned on in response to programmable DC control signals.

21. A programmable logic device comprising core programmable logic that couples to a bank of I/O circuit, wherein the bank of I/O circuit includes the programmable differential output circuit of claim 17.

22. A method of driving a differential output node comprising:

driving a first output node by a first current path;

driving a second output node by a second current path;

providing a first AC boost current that is shared by both the first and second current paths, during a first transition of a differential input signal; and providing a second AC boost current that is shared by both the first and second current paths, during a second transition of the differential input signal that is opposite the first transition.

23. The method of claim 21 further comprising:
providing a first DC current path that is shared by both the first and second current paths; and
providing a second DC current path that is shared by both the first and second current paths.

24. The method of claim 22 further comprising programmably adjusting an amount of the first and second AC boost currents and an amount of DC currents in the first and second DC current paths to vary a differential voltage swing and differential common mode voltage of an output signal on the output node.

* * * * *